United States Patent [19]
Lunquist

[11] 4,146,845
[45] Mar. 27, 1979

[54] AUDIO AMPLIFIER OUTPUT CIRCUIT
[75] Inventor: Richard E. Lunquist, Pompano Beach, Fla.
[73] Assignee: Motorola, Inc., Schaumburg, Ill.
[21] Appl. No.: 881,306
[22] Filed: Feb. 27, 1978
[51] Int. Cl.² ............................................. H03F 3/183
[52] U.S. Cl. ................................... 330/255; 179/1 A; 330/260; 330/261; 330/268
[58] Field of Search ............... 330/252, 255, 257, 260, 330/261, 262, 263, 268; 179/1 A

[56] References Cited
U.S. PATENT DOCUMENTS

| 3,745,477 | 7/1973 | Freeburn | 330/294 X |
| 3,821,656 | 6/1974 | Takeda et al. | 330/255 |
| 3,927,333 | 12/1975 | Furuhashi | 330/263 X |

FOREIGN PATENT DOCUMENTS
2304162  8/1974  Fed. Rep. of Germany ........... 330/255

OTHER PUBLICATIONS
Turner et al., "Amplifier With Current Output," *IBM Technical Disclosure Bulletin*, vol. 13, No. 8, Jan. 1971, pp. 2314–2315.

Primary Examiner—James B. Mullins
Attorney, Agent, or Firm—Margaret Marsh Parker; James W. Gillman

[57] ABSTRACT

A PNP/NPN complementary pair of common emitter connected output transistors are driven by separate differential amplifiers having unity feedback and biasing to prevent simultaneous operation. Only a single battery supply is required.

6 Claims, 3 Drawing Figures

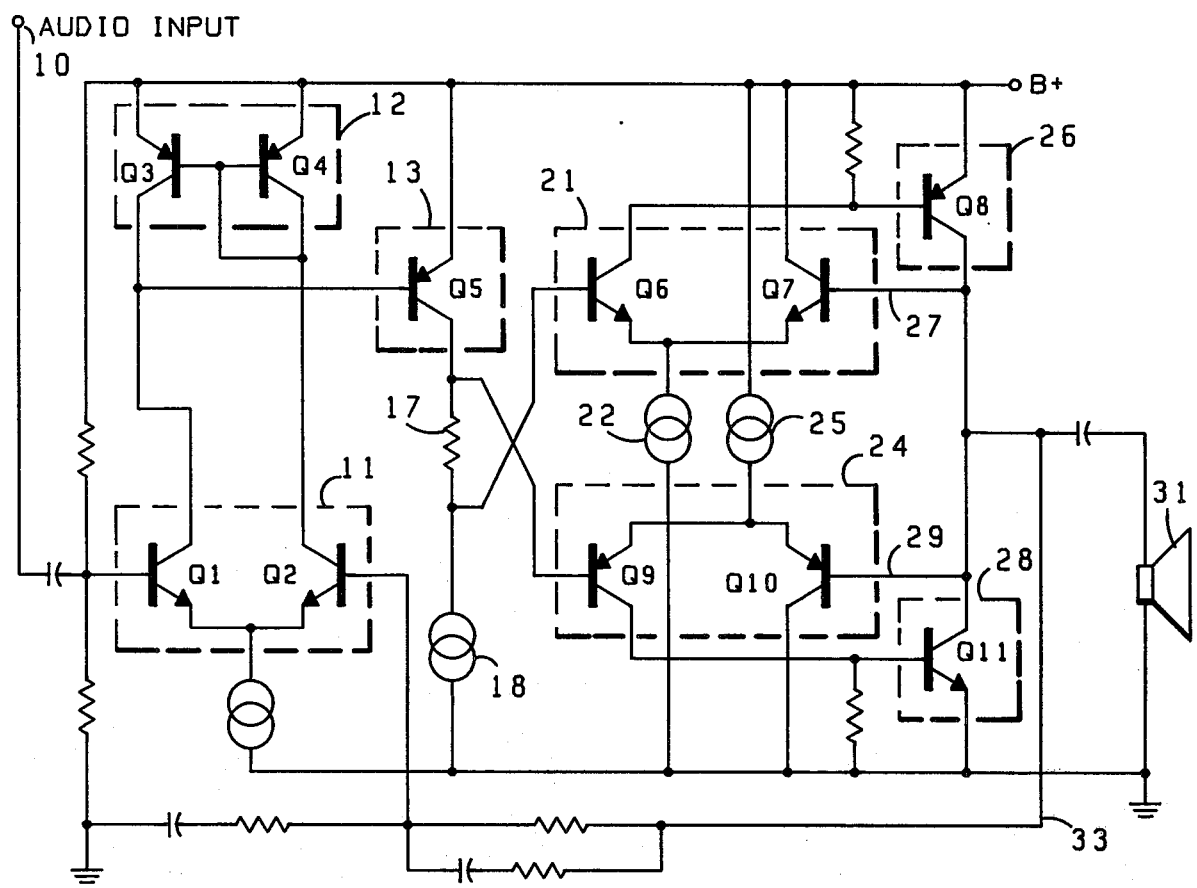
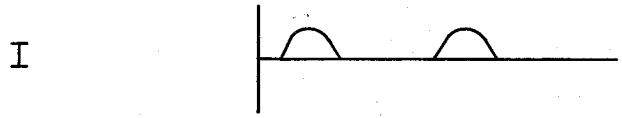
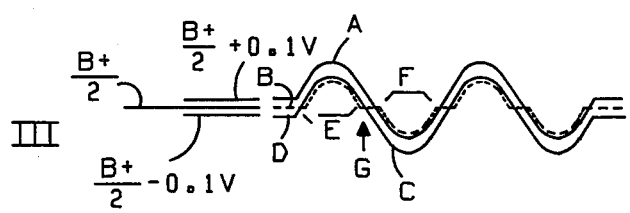
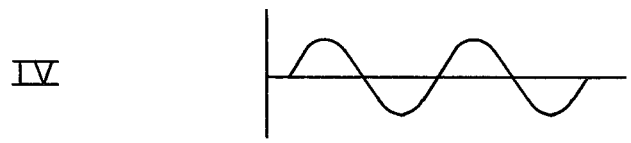

AUDIO AMPLIFIER OUTPUT CIRCUIT

BACKGROUND OF THE INVENTION

The present invention relates to the field of audio output driver stages and more particularly to such circuits as utilized in integrated circuits in miniaturized equipment.

As electronic equipment has become increasingly miniaturized, the circuitry required has typically become based on monolithic or integrated circuitry. Power supplies for such circuitry still remain a size problem, however, and the interconnections between circuitry and battery supplies is frequently a problem. Common emitter connected circuits have been known in the prior art, but have required a tapped or split battery supply. It is desirable to achieve the high efficiency of the common emitter connection for an audio driver stage without requiring a split battery supply.

SUMMARY OF THE INVENTION

It is therefore an object of the present invention to provide an audio circuit for driving the output stages of an audio amplifier without requiring a split battery supply.

It is a more particular object to provide this circuit by utilizing a high efficiency common emitter connection in the driver stages.

The above objects and others are achieved in a circuit in accordance with the present invention wherein two power output stages are connected in series to provide a high level signal for operating a loudspeaker. Each of these output stages is driven by a separate differential amplifier circuit. The two differential amplifiers are coupled to receive an audio input signal, but do not have the same biasing voltage. A resistor is connected in the differential amplifier bias supply line in such a position that one output stage will be turned off before the second one is turned on. If no signal is being received at the input of the circuit, neither output stage will be on. Each differential amplifier receives a feedback signal from the corresponding output stage, and thus tracks the input while it is conducting.

BRIEF DESCRIPTION OF THE DRAWING

FIG. 2 is a schematic diagram of the circuitry of FIG. 1.

FIG. 3 is a timing chart for the circuitry of FIG. 1

DETAILED DESCRIPTION OF A PREFERRED EMBODIMENT

Figure 1:
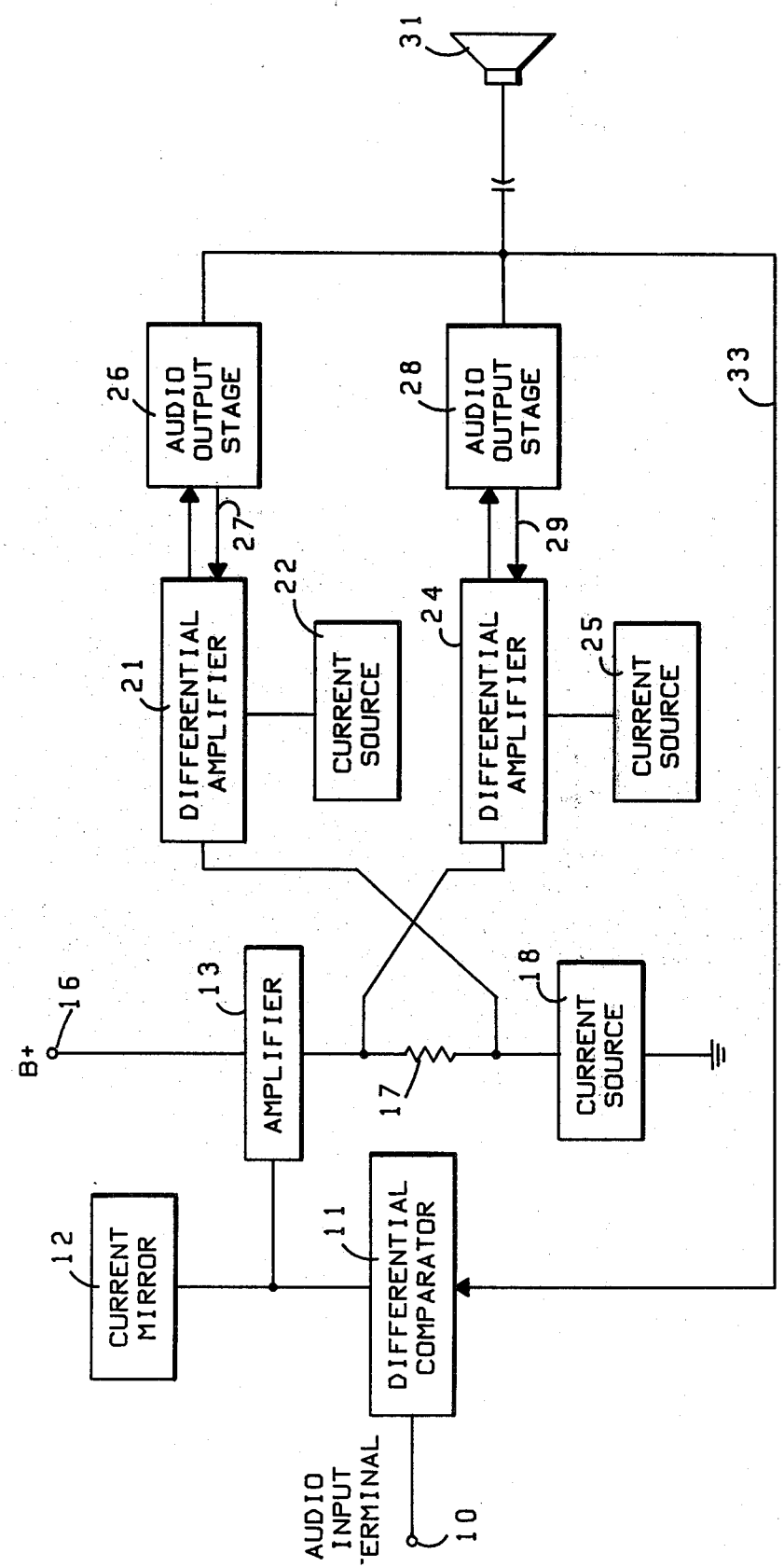
FIG. 1 is a block diagram of the circuitry according to the invention.

In the block diagram of FIG. 1, the terminal 10 supplies an audio signal to the circuitry. This audio signal could come from any one of a number of sources, such as a broadcast signal which has been detected and demodulated, and is now to be amplified to a level sufficient to operate a loudspeaker. The particular application in which the circuitry is most desirable is a battery operated portable unit but the invention is not so limited. The signal from the terminal 10 is coupled to a differential comparator 11 which, in conjunction with a current mirror 12, supplies a signal to a voltage amplifier 13. The amplifier 13 is coupled in series with the battery supply 16, a resistor 17 and a current source 18. The purpose of the resistor 17 will be discussed in detail with respect to FIG. 2. One end of the resistor 17 is coupled to a differential amplifier 21 which in turn is coupled to a current source 22. The other end of the resistor 17 is coupled to another differential amplifier 24 which is coupled to a current source 25. The differential amplifier 21 output is coupled to an output stage 26, and feedback signals are coupled back to the differential amplifier 21 by a feedback loop 27. The differential amplifier 24 output is coupled to an output stage 28, from which a feedback loop 29 couples back to the differential amplifier 24. The output stages 26 and 28 are coupled to operate a loudspeaker 31. A portion of the input signal for the loudspeaker is coupled back to the differential comparator 11 by way of another feedback loop 33.

The operation of the block diagram of FIG. 1 will be further explained with respect to the schematic diagram of FIG. 2 and the timing chart of FIG. 3. The audio signals from the terminal 10 are coupled to a transistor Q1 of the differential comparator 11 and the output signals fed back from the output stages 26 and 28 are coupled to transistor Q2. As is known, such a feedback loop as the loop 33 acts to remove distortion introduced within the circuitry and, in this case, particularly the cross-over distortion as will be explained hereinbelow. The current mirror 12 is formed of the transistor Q3 and a diode-connected transistor Q4. The signal from the collector of Q1 is coupled to a transistor Q5 which is one embodiment of the voltage amplifier 13. This signal contains the input signal plus a compensating signal to eliminate or attenuate the cross-over distortion which may be introduced within the circuitry.

The output of the voltage amplifier transistor Q5 is coupled to one portion of the differential amplifier 21 which portion comprises a transistor Q6. Also coupled to transistor Q6 is a biasing voltage from the lower voltage side of the resistor 17. The second portion of the differential amplifier 21 comprises a transistor Q7 and is coupled to receive a feedback signal from the output stage 26. When there is no signal input, the biasing voltage for the transistor Q7 is approximately B+/2. As the input voltage for Q6 begins to rise (curve I, FIG. 3), the voltage at the collector of a transistor Q8 and hence the voltage on the base of Q7 will also rise and the voltages at the bases of Q6 and Q7 will track, i.e., the transistor Q6 supplies just enough current to the base of Q8 to enable the voltage at the collector of Q8 to track the input signal at the base of Q6. The remainder of the current from the current source 22 is diverted to ground through Q7. As the input for Q6 returns toward zero, the output of the output stage 26 (curve D) will also return. The output stage 26 may be embodied by a transistor Q8 as shown in FIG. 2. The differential amplifier 24 is made up of transistors Q9 and Q10, which will be PNP transistors if the transistors Q6 and Q7 are NPN type and, with the biasing connection as shown in FIG. 2, there will be a very brief interval between the end of conduction in differential amplifier 21 and the beginning of conduction in differential amplifier 24. The differential biasing of resistor 17 keeps Q6 and Q9 from being on at the same time. Once amplifier 24 is on, it behaves just as did amplifier 21, and the output of Q10 tracks the input to Q9, providing the signals as shown in curve II of FIG. 3. These signals are amplified in the current amplifier Q11, and are coupled to the output signals from Q8 to operate the loudspeaker 31.

FIG. 3, III illustrates the principle of operation of the circuitry as the outputs would appear if the feedback loop 33 were not included. Curve A is the signal on the base of transistor Q9 and curve C is the signal on the base of Q6. Curve B would be the combined signal outputs of Q7 and Q10. During the period "D", both Q6 and Q9 are biased into nonconduction. During the period "E", both B and C begin to rise and Q6 begins to conduct, with Q7 tracking. At the end of period "E", Q6 is turned off, but Q9 does not begin to conduct until the beginning of period "F". Thus, without the feedback loop 33 the composite signal B would have the cross-over period indicated at "G". The feedback loop 33 from the output stages Q8 and Q11, however, causes a compensating effect to be introduced at the differential comparator 11, and the signal coupled to the voltage amplifier 13 is adjusted to compensate for the cross-over distortion term in curve D, and to produce an output approaching or becoming the waveform seen in curve IV.

Since the differential amplifiers are capable of driving Q8 and Q11 into saturation, essentially the total swing of the power supply can be used in the output.

By means of the present invention, an audio circuit has been provided wherein the high efficiency of common emitter connected circuitry is retained while a single, untapped power supply is required. It will be apparent that other modifications and variations of the invention are possible, and it is contemplated to include all those which fall within the spirit and scope of the appended claims.

What is claimed is:

1. An audio frequency circuit comprising in combination:
   a source of input signal;
   a single source of supply voltage;
   a reference voltage terminal;
   first and second power output stages comprising a complementary pair of transistors and connected in series between the supply voltage source and the reference terminal;
   a first output terminal connected to the connection point of the first and second output stages and a second output terminal connected to the reference voltage terminal;
   a first differential amplifier means coupled to control the first power output stage and having a first portion for receiving an input signal and a first biasing voltage, a second portion coupled to receive a second biasing voltage from the output of the first power output stage;
   a second differential amplifier means coupled to control the second power output stage and having a first portion for receiving an input signal and a third biasing voltage, and a second portion coupled to receive a fourth biasing voltage from the second power output stage, the first and third biasing voltages having a fixed offset so that the first differential amplifier does not provide an output voltage when the second differential amplifier is providing an output voltage;
   comparator means for receiving an input signal; and
   feedback means coupled to the first output terminal and to the comparator means for altering the input signal to remove from the output signal of the circuit any discontinuity caused by the offset in the first and third biasing voltages.

2. An audio frequency circuit in accordance with claim 1, wherein each of the first and second differential amplifiers comprises a pair of transistors, one pair being complementary to the other pair.

3. An audio frequency circuit in accordance with claim 1 wherein the first and second power output stages are coupled to actuate a loudspeaker.

4. An audio frequency circuit in accordance with claim 1 wherein the first and third biasing voltages are supplied from first and second ends of a biasing resistor means, said resistor means being coupled to a DC supply source and said offset voltage being developed across said resistor.

5. An audio frequency circuit in accordance with claim 1 wherein the output of the comparator means is coupled to the first and second differential amplifier means.

6. An audio frequency circuit in accordance with claim 5 and further including current mirror means coupled to the comparator means for cooperation therewith in altering the input signal.

* * * * *